US012660374B2

(12) United States Patent
Huang et al.

(10) Patent No.: US 12,660,374 B2
(45) Date of Patent: Jun. 16, 2026

(54) LIGHT-EMITTING DIODE CHIP, SEMICONDUCTOR LIGHT-EMITTING DEVICE, AND DISPLAY DEVICE

(71) Applicant: Quanzhou Sanan Semiconductor Technology Co., Ltd., Fujian (CN)

(72) Inventors: Yi-Jui Huang, Changhua County (TW); Tsung-Ming Lin, Xiamen (CN); Chung-Ying Chang, Xiamen (CN); Yu-Tsai Teng, Xiamen (CN)

(73) Assignee: QUANZHOU SANAN SEMICONDUCTOR TECHNOLOGY CO., LTD., Nanan City (CN)

( * ) Notice: Subject to any disclaimer, the term of this patent is extended or adjusted under 35 U.S.C. 154(b) by 552 days.

(21) Appl. No.: 17/837,970

(22) Filed: Jun. 10, 2022

(65) Prior Publication Data

US 2022/0406966 A1     Dec. 22, 2022

(30) Foreign Application Priority Data

Jun. 18, 2021    (CN) .......................... 202110676607.1

(51) Int. Cl.
| | |
|---|---|
| *H10H 20/814* | (2025.01) |
| *H10H 20/84* | (2025.01) |
| *H10H 20/857* | (2025.01) |
| *H10W 90/00* | (2026.01) |

(52) U.S. Cl.
CPC .......... *H10H 20/814* (2025.01); *H10H 20/84* (2025.01); *H10H 20/857* (2025.01); *H10W 90/00* (2026.01)

(58) Field of Classification Search
None
See application file for complete search history.

(56) References Cited

U.S. PATENT DOCUMENTS

| | | | | |
|---|---|---|---|---|
| 2005/0126471 A1* | 6/2005 | Jenny | ...................... | C30B 33/00 |
| | | | | 117/92 |
| 2016/0085067 A1* | 3/2016 | Payne | .................. | G02B 5/0825 |
| | | | | 219/121.61 |
| 2017/0373045 A1* | 12/2017 | Welch | ...................... | H01L 33/60 |
| 2018/0130926 A1* | 5/2018 | Huang | .................... | H01L 33/14 |
| 2021/0119086 A1* | 4/2021 | Wang | ...................... | H10H 20/84 |

* cited by examiner

*Primary Examiner* — Feifei Yeung Lopez
(74) *Attorney, Agent, or Firm* — MUNCY, GEISSLER, OLDS & LOWE, P.C.

(57)    ABSTRACT

A light-emitting diode (LED) chip includes a semiconductor epitaxial structure and a reflective structure. The reflective structure is formed on an upper surface and side surfaces of the semiconductor epitaxial structure. The reflective structure has a reflectance of less than 30% for light having a first wavelength which is different from a wavelength of light emitted from the semiconductor epitaxial structure. A semiconductor light-emitting device including the LED chip, and a display device including a plurality of the LED chips are also disclosed.

16 Claims, 5 Drawing Sheets

—— DBR1: Conventional reflective structure
— — DBR2: Reflective structures of the embodiment A semiconductor epitaxial structure including a first semiconductor layer, an active layer, and a second semiconductor layer that are sequentially grown and stacked in such order is formed. ~S101

A reflective structure is formed on an upper surface and side surfaces of the semiconductor epitaxial structure. ~S102

LIGHT-EMITTING DIODE CHIP, SEMICONDUCTOR LIGHT-EMITTING DEVICE, AND DISPLAY DEVICE

CROSS-REFERENCE TO RELATED APPLICATION

This application claims priority of Chinese Invention Patent Application No. 202110676607.1, filed on Jun. 18, 2021.

FIELD

The disclosure relates to a light-emitting diode chip, a semiconductor light-emitting device, and a display device.

BACKGROUND

Stealth dicing is generally used for dicing light-emitting diode (LED) chips during the manufacturing process thereof.

Referring to FIG. 1, a conventional LED chip that is to be diced includes a light-emitting epitaxial structure 11 that is disposed on a front side of a substrate 10, a reflective structure 12 that covers a surface of the light-emitting epitaxial structure 11 opposite to the substrate 10, and a pair of electrodes 13 that are formed on the reflective structure 12 and that are electrically connected to the light-emitting epitaxial structure 11. The reflective structure 12 generally having a reflectance of about 20% for a laser beam 20 and the electrodes 13 cooperate to form a reflective mirror structure similar to an omni-directional reflector (ODR), which may increase a transmittance of scattered laser light inside the semiconductor epitaxial structure 11.

To perform stealth dicing on the conventional LED chip, the laser beam 20 having a certain wavelength is used to irradiate a back side of the substrate 10 opposite to the front side, and stealth dicing traces are formed inside the substrate 20. Specifically, the laser beam 20, upon entering the substrate 10, is scattered inside the substrate 10, and the scattered laser beam thus generated might further enter the light-emitting epitaxial structure 11 and be transmitted to the reflective structure 12 and the electrodes 13, where the scattered laser beam is partially reflected back to the light-emitting epitaxial structure 11. However, this approach might cause damage to the epitaxial structure 11 and in turn increase the risk of current leakage in the LED chips. The problem of current leakage caused by the scattered laser beam is not easy to manage, nor easy to troubleshoot when conducting subsequent quality checks on the LED chips and light-emitting devices including the same.

Thus, there is a need for effectively preventing possible damage to the semiconductor epitaxial structure, caused by the scattered laser beam during stealth dicing.

SUMMARY

Therefore, an object of the disclosure is to provide a light-emitting diode chip, a method for manufacturing a light-emitting diode chip, a semiconductor light-emitting device, and a display device each of which can alleviate at least one of the drawbacks of the prior art.

According to a first aspect of the disclosure, a light-emitting diode (LED) chip includes a semiconductor epitaxial structure and a reflective structure. The semiconductor epitaxial structure includes a first semiconductor layer, an active layer, and a second semiconductor layer which are stacked on one another in such order. The reflective structure is formed on an upper surface and side surfaces of the semiconductor epitaxial structure. The reflective structure has a reflectance of less than 30% for light having a first wavelength which is different from a wavelength of light emitted from the semiconductor epitaxial structure.

According to a second aspect of the disclosure, a light-emitting diode (LED) chip includes a semiconductor epitaxial structure and a reflective structure. The semiconductor epitaxial structure includes a first semiconductor layer, an active layer, and a second semiconductor layer which are stacked on one another in such order. The reflective structure is formed on an upper surface and side surfaces of the semiconductor epitaxial structure. A part of the reflective structure disposed on the side surfaces of the semiconductor epitaxial structure forms an optical waveguide structure to allow light having a first wavelength, upon entering the optical waveguide structure, to be transmitted therethrough and emitted outwardly. The first wavelength is different from a wavelength of light emitted from the semiconductor epitaxial structure.

According to a third aspect of the disclosure, a semiconductor light-emitting device includes a packaging frame and the aforesaid LED chip that is mounted on the packaging frame.

According to a forth aspect of the disclosure, a display device including a circuit board and a plurality of the aforesaid LED chips that are electrically connected to the circuit board.

BRIEF DESCRIPTION OF THE DRAWINGS

Other features and advantages of the disclosure will become apparent in the following detailed description of the embodiment(s) with reference to the accompanying drawings, of which.

DETAILED DESCRIPTION

Figure 1:
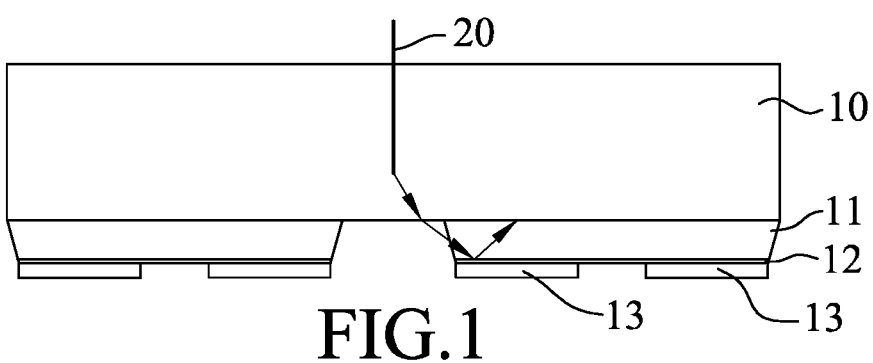
FIG. 1 is a schematic view illustrating a laser beam scattered in a conventional LED chip during stealth dicing.

Before the disclosure is described in greater detail, it should be noted that where considered appropriate, reference numerals or terminal portions of reference numerals have been repeated among the figures to indicate corresponding or analogous elements, which may optionally have similar characteristics.

In order to reduce or prevent damage caused by a laser beam to an epitaxial structure of the conventional LED chip during stealth dicing, the present disclosure mainly aims to improve the configuration of a reflective structure of the LED chip.

Figure 2:
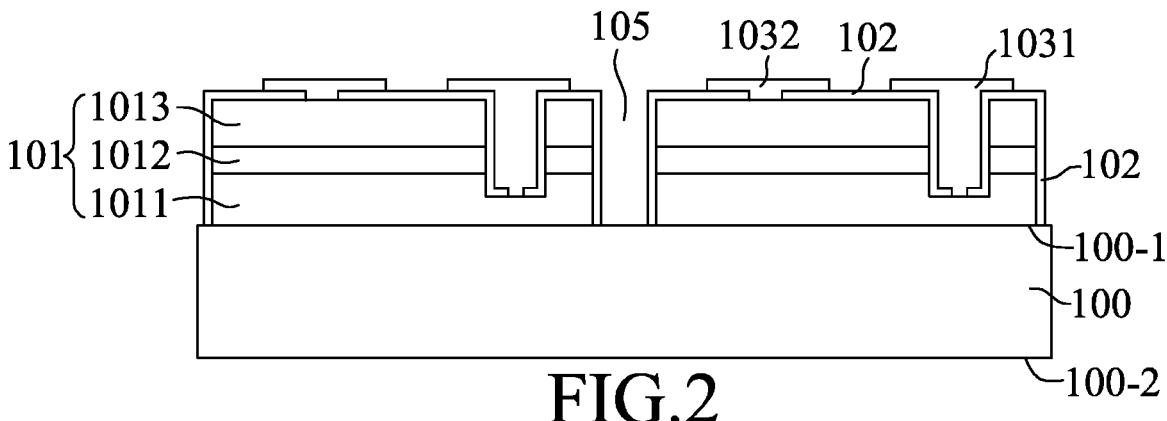
FIG. 2 is a schematic view illustrating an embodiment of a light-emitting diode (LED) chip according to the present disclosure.

Referring to FIG. 2, an embodiment of the LED chip according to this disclosure includes a semiconductor epitaxial structure 101 and a reflective structure 102.

The LED chip may be any type of LED chip such as a red light LED chip, a blue light LED chip, or an ultraviolet light LED chip. In this embodiment, the LED chip is a blue or ultraviolet light LED chip (exemplified as a blue light LED chip in the description below). In such case, the LED chip may further include a substrate 100 having opposite front and back surfaces 100-1, 100-2.

The substrate 100 may be a silicon substrate, a silicon carbide substrate, a sapphire substrate, or any other substrates suitable for the growth of the semiconductor epitaxial structure 101. In this embodiment, for ease of description, the substrate 100 is exemplified as a sapphire substrate.

The semiconductor epitaxial structure is formed on the front surface 100-1 of the substrate 100. The semiconductor epitaxial structure 101 includes a first semiconductor layer 1011, an active layer 1012, and a second semiconductor layer 1013 which are stacked on the front surface 100-1 in such order. The first semiconductor layer 1011 may be an n-type semiconductor layer such as an n-type doped GaN layer. The active layer 1012 may be a multiple quantum well (MQW) layer. The second semiconductor layer 1013 may be a p-type semiconductor layer such as a p-type doped GaN layer. As shown in FIG. 2, a part of the semiconductor epitaxial structure 101 may be etched to form at least one cutting channel 105 exposing the front surface 100-1 of the substrate, and a dicing process may be performed on the substrate 100 along the cutting channel 105, so as to obtain individual LED chips.

The reflective structure 102 is formed on an upper surface and side surfaces of the semiconductor epitaxial structure 101. A part of the reflective structure 102 disposed on the side surfaces of the semiconductor epitaxial structure 101 (i.e., the cutting channel 105) forms an optical waveguide structure to allow light having a first wavelength, upon entering the optical waveguide structure, to be transmitted therethrough and emitted outwardly. The first wavelength is different from a wavelength of light emitted from the semiconductor epitaxial structure 101. In this embodiment, the light having the first wavelength is a laser beam 200 (see FIG. 3) that is irradiated on the back surface 100-2 of the substrate 100 and that is adapted for performing stealth dicing on the LED chip. In some embodiments, the first wavelength of the laser beam 200 ranges from about 1000 nm to about 1200 nm, such as from 1014 nm to 1114 nm.

Figure 8:
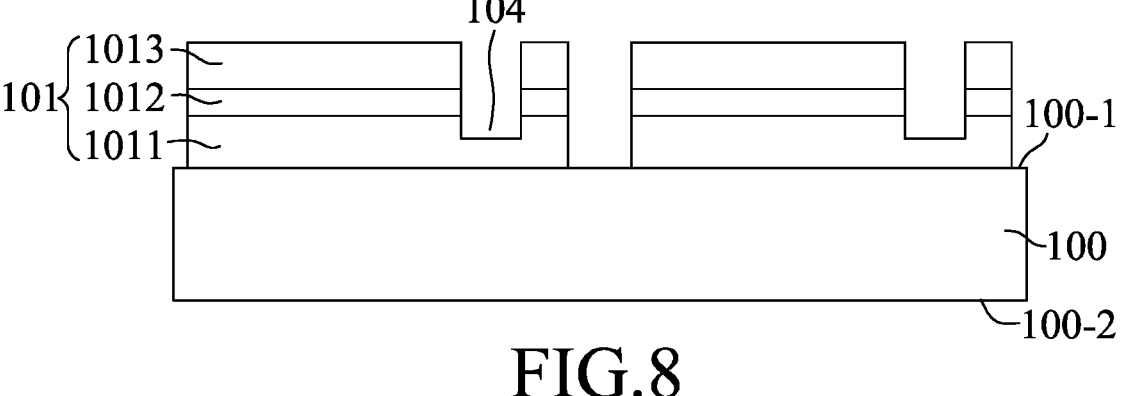

Further referring to FIG. 8, the LED chip may have a flip-chip structure, and the semiconductor epitaxial structure 101 may be formed with at least one indentation 104 that extends through the second semiconductor layer 1013 and the active layer 1012, and that exposes a part of the first semiconductor layer 1011. In such case, the reflective structure 102 is formed on the upper surface and all of the side surfaces of the semiconductor epitaxial structure 101, including the side surfaces defining the indentation 104. The reflective structure 102 may have a reflectance of greater than 85% for light emitted from the semiconductor epitaxial structure 101.

In some embodiments, the reflective structure 102 includes a distributed Bragg reflector (DBR) structure that includes n pairs of layers. Each of the pairs includes a first material layer and a second material layer having different refractive indices, and is configured to almost fully or fully transmit the light having the first wavelength within the DBR structure. The first and second material layers are alternately stacked, and n is an integer that is greater than or equal to 1. The first material layer may have a refractive index greater than that of the second material layer. The first material layer may be made of at least one material having a relatively high refractive index and selected from the group consisting of $TiO_2$, $Nb_2O_5$, $TA_2O_5$, $HfO_2$, $ZrO_2$, and ZnO. The second material layer may be made of at least one material having a relatively low refractive index and selected from the group consisting of $SiO_2$, $MgF_2$, $Al_2O_5$, and SiON. By adjusting optical thickness of each of the first and second material layers and the number of the pair through optical simulation, the DBR structure of this embodiment is configured to allow the light having the first wavelength (e.g., the laser beam 200 for performing stealth dicing) to be fully transmitted, and allow the light emitted from the active layer of the semiconductor epitaxial structure 101 to be reflected back thereto. The DBR structure may include more than 3 pairs of the layers, e.g., more than 5 pairs of the layers. In some embodiments, the number of the pairs (i.e., n) ranges from 2 to 40.

Figure 3:
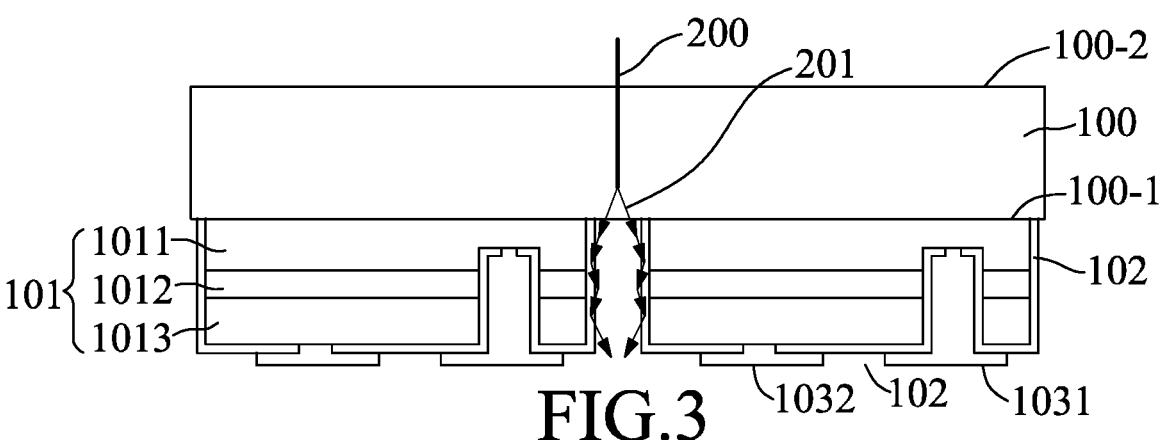
FIG. 3 is a schematic view illustrating a path of a laser beam transmitted in a reflective structure of the embodiment which forms an optical waveguide structure.

To be specific, referring to FIG. 3, when the stealth dicing is performed on the back side 100-2 of the substrate 100, the laser beam 200 enters the substrate 100 and is scattered within the substrate 100 to generate a scattered laser beam 201. The scattered laser beam 201 then passes through the front surface 100-1 of the substrate 100 and enters the reflective structure 102 on the side surfaces of the semiconductor epitaxial structure 101. With the first and second material layers of the reflective structure 102 having different refractive indices, the scattered laser beam 201 is transmitted and guided by the optical waveguide structure formed from the reflective structure 102 through multiple reflections inside the reflective structure 102, and is finally emitted outwardly without entering the semiconductor epitaxial structure 101. Thus, the semiconductor epitaxial structure 101 can be prevented from being damaged by the scattered laser beam 201 coming from the laser beam 200 when performing stealth dicing on the LED chip.

Figure 5:
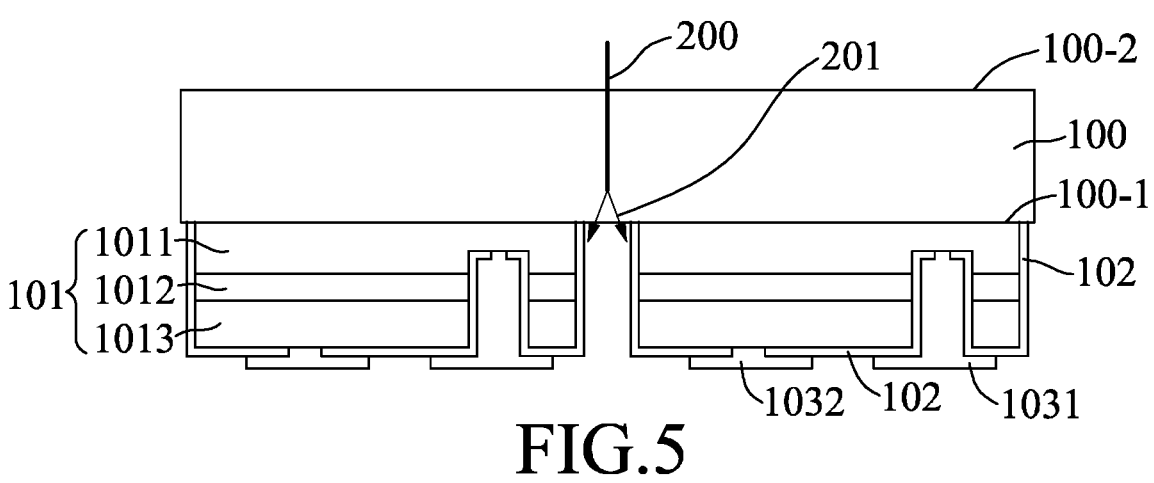
FIG. 5 is a schematic view similar to FIG. 3, showing a variation of the embodiment of the LED chip according to the present disclosure.

Referring to FIG. 5, in a variation of the embodiment, the reflective structure 102 has a reflectance of less than 30%, less than 20%, less than 10%, less than 5%, or even close to 0% for light having the first wavelength. That is, the reflective structure 102 is configured to absorb the scattered laser light that is generated from the laser beam adapted to perform stealth dicing on the LED chip. In such variation of the embodiment, the reflective structure 102 includes a DBR structure that includes m pairs of layers. Each of the pairs includes a first material layer and a second material layer having different refractive indices, and is configured to partially absorb the light having the first wavelength. The first and second material layers are alternately stacked, and m is an integer that is greater than or equal to 1. The first material layer has a refractive index greater than that of the second material layer. The first material layer may be made of at least one material having a relatively high refractive index and selected from the group consisting of $TiO_2$, $Nb_2O_5$, $TA_2O_5$, $HfO_2$, $ZrO_2$, and ZnO. The second material layer may be made of at least one material having a relatively low refractive index and selected from the group consisting of $SiO_2$, $MgF_2$, $Al_2O_5$, and SiON. The DBR structure may include more than 3 pairs of the layers, such as more than 5 pairs of the layers. In order to ensure that the reflective structure 102 can reflect the light emitted from the active layer of the semiconductor epitaxial structure 101, the number of the pairs (i.e., m) may range from 2 to 40, such as from 5 to 13. By adjusting the optical thickness of each of the first and second material layers and the number of the pairs through optical simulation, the DBR structure in the variation of the embodiment is configured to fully absorb the scattered laser beam 200 during the stealth dicing process of the LED chip.

The optical thicknesses of the first and second material layers of the reflective structure 102 of the variation of the embodiment that is configured to absorb the light having the first wavelength may be different from the optical thicknesses of the first and second material layers of the reflective structure 102 of the embodiment that is configured to fully transmit the light having the first wavelength.

Figure 4:
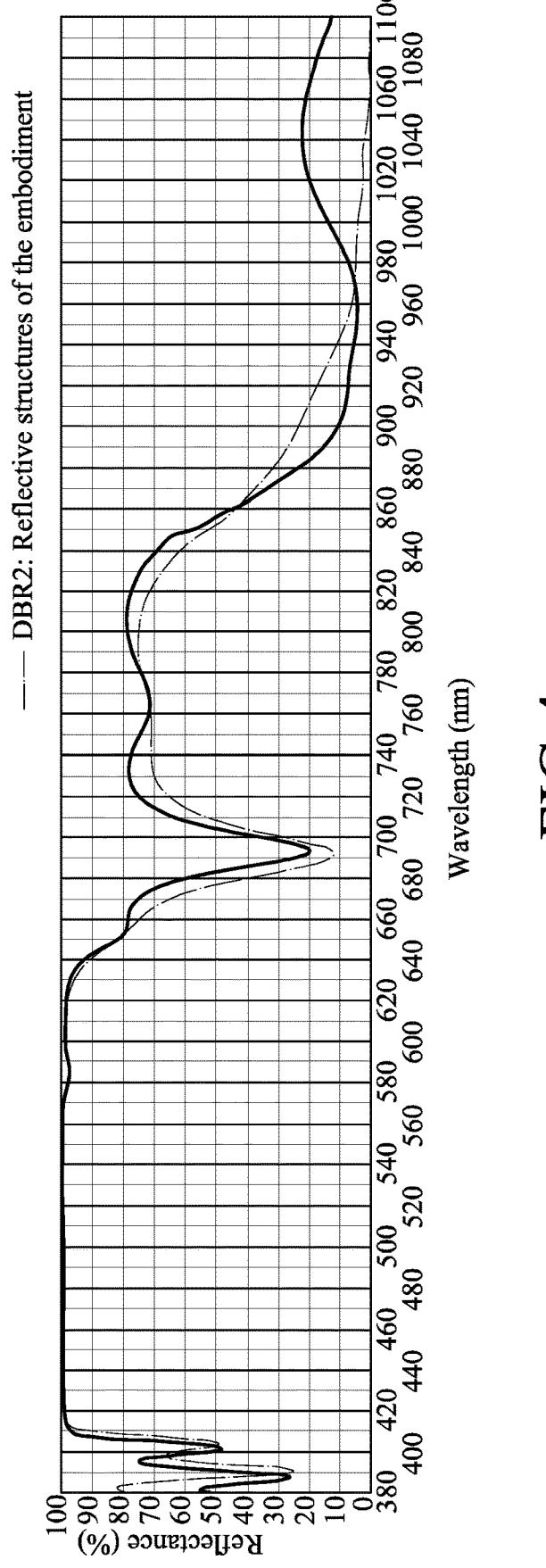
FIG. 4 is a schematic graph showing spectral reflectance of the reflective structure of the embodiment and a conventional reflective structure.

FIG. 4 shows a comparison between the spectral reflectance of the reflective structure of the variation of the embodiment, which is configured to absorb the scattered laser light, and the spectral reflectance of a conventional reflective structure (a DBR structure). It can be seen from FIG. 4 that the reflectance of the conventional reflective structure for light having a wavelength ranging from about 1000 nm to at least 1100 nm (such as up to 1200 nm) is about 20%, while the reflectance of the reflective structure of the present disclosure for light having the same wavelength is relatively lower, i.e., less than 30%, less than 20%, less than 10%, less than 5%, or even close to 0%. This means that, when the scattered laser beam 201 enters the reflective structure 102 on the side surfaces of the semiconductor epitaxial structure 101 during the stealth dicing process of the LED chip in this disclosure, the reflective structure 102 can absorb a large part of the scattered laser beam 201, and can even fully absorb the scattered laser beam 201, thereby preventing the semiconductor epitaxial structure 101 from being damaged by the scattered laser beam 201.

Referring back to FIG. 2, the LED chip of the embodiment further includes an electrode structure that is formed on the reflective structure 102. The electrode structure includes a first electrode 1031 that is electrically connected to the first semiconductor layer 1011, and a second electrode 1032 that is electrically connected to the second semiconductor layer 1013. The first electrode 1031 may be formed by filling a first hole that exposes a part of the first semiconductor layer 1011 through etching of the reflective structure 102 with a metallic conductive material. The second electrode 1032 may be formed by filling a second hole that exposes a part of the second semiconductor layer 1012 through etching of the reflective structure 102 with a metallic conductive material.

Figure 6:
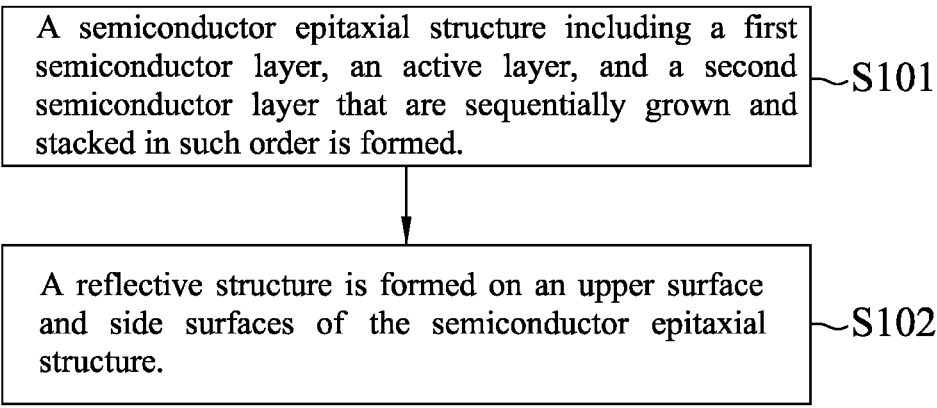
FIG. 6 is a flow chart illustrating an embodiment of a method for manufacturing a LED chip according to the present disclosure.

According to this disclosure, referring to FIG. 6, an embodiment of a method for manufacturing the abovementioned LED chip includes the following consecutive steps.

Figure 7:
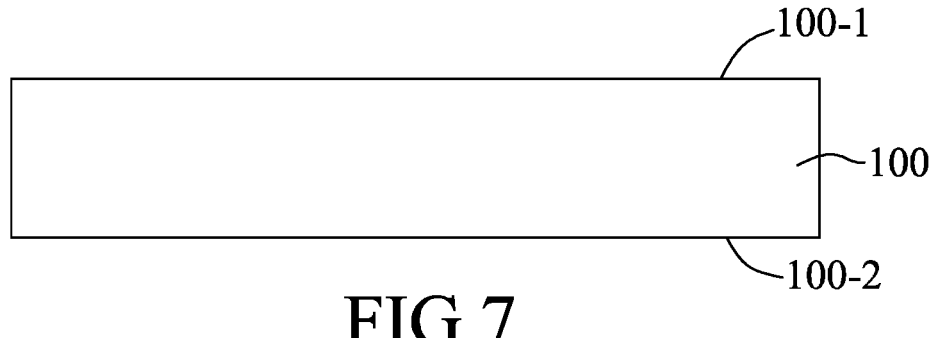
FIGS. 7 to 9 are schematic views illustrating consecutive steps of the embodiment of the method for manufacturing a LED chip according to the present disclosure.

In step S101, referring to FIGS. 7 and 8, the semiconductor epitaxial structure 101 is formed, e.g., on the substrate 100. Specifically, the semiconductor epitaxial structure 101 includes the first semiconductor layer 1011, the active layer 1012, and the second semiconductor layer 1013 that are sequentially grown and stacked on the back surface 100-1 of the substrate 100 in such order.

When the LED chip that is to be made has a flip-chip structure, the semiconductor epitaxial structure 101 may be further subjected to an etching process to from at least one indentation 104 that extends through the second semiconductor layer 1013 and the active layer 1012, and that exposes a part of the first semiconductor layer 1011.

Figure 9:
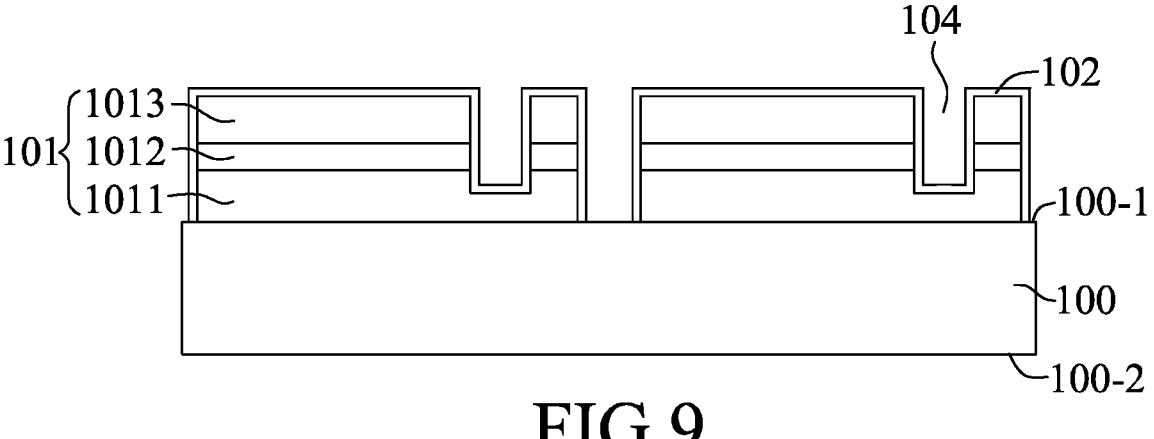

In step S102, referring to FIG. 9, the reflective structure 102 is formed on the upper surface and side surfaces of the semiconductor epitaxial structure 101. When the semiconductor epitaxial structure 101 formed with the at least one indentation 104, the reflective structure 102 is also formed on the side surfaces defining the indentation 104. That is, the reflective structure 102 may be conformally disposed on the semiconductor epitaxial structure 101.

In certain embodiments, the reflective structure 102 is formed to have a reflectance of less than 30% for light having the first wavelength. In other embodiments, a part of the reflective structure 102 disposed on the side surfaces of the semiconductor epitaxial structure 101 forms the optical waveguide structure to allow light having the first wavelength, upon entering the optical waveguide structure, to be transmitted therethrough and emitted outwardly.

The reflective structure 102 may include the distributed Bragg reflector (DBR) structure which includes a plurality of pairs (e.g., n or m pairs as defined above) of first and second material layers. The details of the first and second material layers of the reflective structure 102 are the same as described above, and thus are omitted herein for sake of brevity.

The method of this embodiment may further include a step of forming the electrode structure including the first electrode 1031 and the second electrode 1032 on the reflective structure 102 (see FIG. 2).

For example, a part of the reflective structure 102 located within the indentation 104 is etched to form the first hole exposing the first semiconductor layer 1011, and a part of the reflective structure 102 on the second semiconductor layer 1012 is etched to form the second hole exposing the second semiconductor layer 1012. Then, the first and second hole are filled with metallic conductive materials, so as to form the first electrode 1031 that is electrically connected to the first semiconductor layer 1011 through the first hole, and the second electrode 1032 that is electrically connected to the second semiconductor layer 1013 through the second hole.

After forming the electrode structure, the method may further include a step of performing stealth dicing on the back surface 100-2 in a position corresponding to the cutting channel 105 using the light having the first wavelength (e.g., laser beam 200 shown in FIGS. 3 and 5), so as to obtain a plurality of individual LED chips of this disclosure.

It should be noted that, in the description above, the LED chip is exemplified as a blue light LED chip. If the LED chip to be made is a red light LED chip, the method further includes a step of bonding the semiconductor epitaxial structure 101 to a permanent substrate, and a step of removing a growth substrate. These steps are well known in the art and thus the details thereof are omitted herein.

Figure 10:
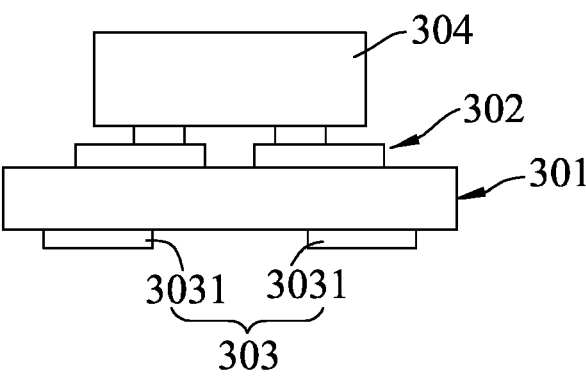
FIG. 10 is a schematic view illustrating an embodiment of a semiconductor light-emitting device according to the present disclosure.

The present disclosure also provides a semiconductor light emitting device. Referring to FIG. 10, an embodiment of the semiconductor light emitting device 300 includes a packaging frame 301, and the aforementioned LED chip of this disclosure 304 that is mounted on the packaging frame 301.

The packaging frame 301 can be any packaging frame suitable for mounting a semiconductor light-emitting element. The packaging frame 301 may be a flat frame as shown in FIG. 10, or alternatively, an indented frame formed with a recess. The packaging frame 301 includes two die bonding areas 302 that are located on an upper surface of the packaging frame 301, and two electrodes of the LED chip 304 are respectively connected to the die bonding areas 302. A lower surface of the packaging frame 301 opposite to the upper surface is provided with an electrode layer 303 including two electrodes 3031 that are spaced apart from each other and that are electrically connected to an external power source.

The semiconductor light emitting device 300 may further include an encapsulating body (not shown in the figures) covering the LED chip 304.

Figure 11:
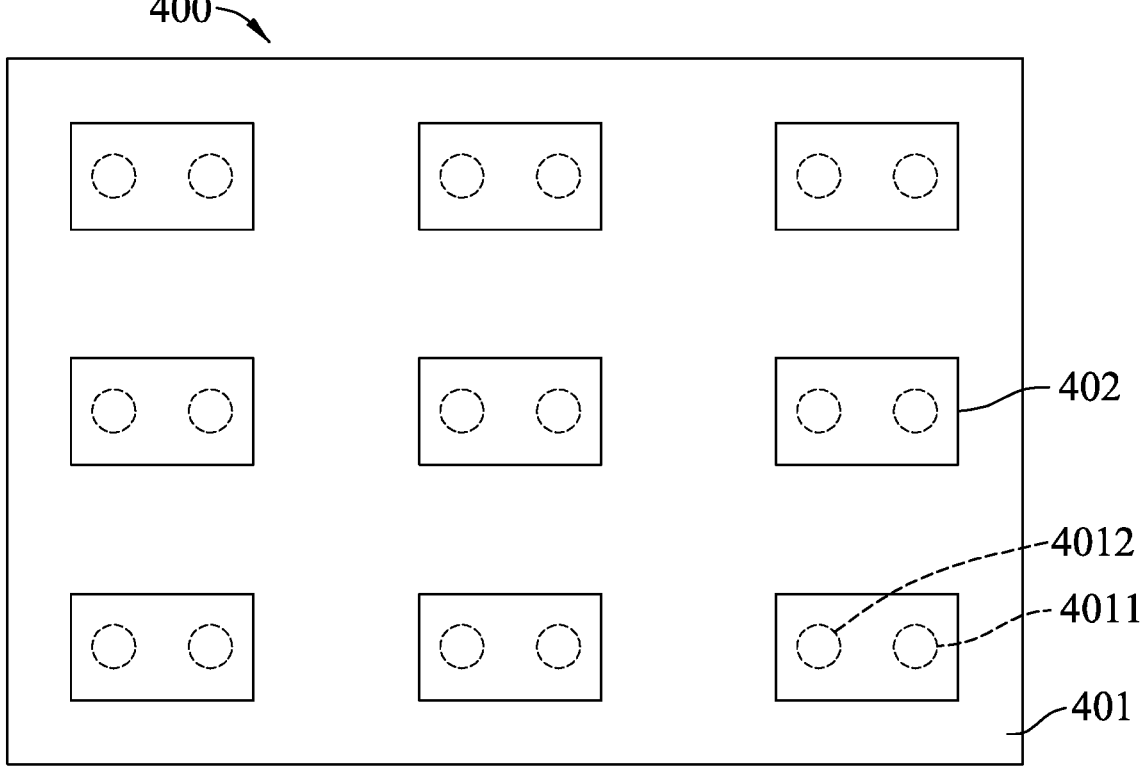
FIG. 11 is a schematic view illustrating an embodiment of a display device according to the present disclosure.

In addition, the present disclosure provides a display device 400. Referring to FIG. 11, an embodiment of the display device 400 includes a circuit board 401 and a plurality of LED chips 402 mentioned above that are electrically connected to the circuit board 401. The circuit board 401 has a plurality of sets of pads, each set of pads includes a first pad 4011 and a second pad 4012 that are bonded and electrically connected to the first and second electrodes 1031, 1032 of a corresponding one of the LED chips 402 via, e.g., conductive adhesives. The LED chips 402 may be arranged on the circuit board 401 in any suitable manner according to actual needs. In this embodiment, the LED chips 402 are arranged in an array on the circuit board 401.

With the LED chip(s) 304, 402 of the present disclosure, the semiconductor light emitting device 300 and the display device 400 exhibit enhanced reliability.

In sum, the LED chip of this disclosure includes the reflective structure 102 that is conformally formed on the upper surface and side surfaces of the semiconductor epitaxial structure 101, and that is configured to have a reflectance of less than 30% for the laser beam adapted for stealth dicing or configured to form the optical waveguide structure to allow the laser beam, upon entering the optical waveguide structure, to be transmitted therethrough and emitted outwardly. That is, during the stealth dicing process, the scattered laser beam can be absorbed by the reflective structure or guided by the optical waveguide structure outwardly away from the semiconductor epitaxial structure 101. As such, the amount of the laser beam entering the semiconductor epitaxial structure during the stealth dicing process can be minimized, i.e., the damage caused thereby can be effectively reduced, so as to prevent the LED chip of this disclosure from experiencing current leakage, thereby enhancing device reliability.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A light-emitting diode (LED) chip, comprising:
a substrate having a front surface;
a semiconductor epitaxial structure formed on said front surface of said substrate and comprising a first semiconductor layer, an active layer, and a second semiconductor layer which are stacked on one another in such order; and
a reflective structure extending upwardly from said front surface of said substrate and formed on an upper surface and side surfaces of said semiconductor epitaxial structure, said reflective structure having a reflectance of less than 30% for light having a first wavelength which is different from a wavelength of light emitted from said semiconductor epitaxial structure, said reflective structure including a distributed Bragg reflector structure which fully transmits the light having the first wavelength,
wherein the light having the first wavelength is a laser beam that is adapted for performing stealth dicing on said LED chip, and
wherein the first wavelength of the laser beam ranges from 1000 nm to 1200 nm.

2. The LED chip as claimed in claim 1, wherein said distributed Bragg reflector structure comprises m pairs of layers, each pair comprising a first material layer and a second material layer having different refractive indices, said first and second material layers in said distributed Bragg reflector structure being alternately stacked, m being an integer that is greater than or equal to 1, said first material layer having a refractive index greater than that of said second material layer.

3. The LED chip as claimed in claim 2, wherein m is an integer ranging from 2 to 40.

4. The LED chip as claimed in claim 2, wherein said first material layer is made of at least one material selected from the group consisting of $TiO_2$, $Nb_2O_5$, $TA_2O_5$, $HfO_2$, $ZrO_2$, and ZnO, and said second material layer is made of at least one material selected from the group consisting of $SiO_2$, $MgF_2$, $Al_2O_5$, and SiON.

5. The LED chip as claimed in claim 1, wherein said reflective structure has a reflectance of greater than 85% for light emitted from said semiconductor epitaxial structure.

6. A light-emitting diode (LED) chip comprising:
a substrate having a front surface;
a semiconductor epitaxial structure formed on said front surface of said substrate and comprising a first semiconductor layer, an active layer, and a second semiconductor layer which are stacked on one another in such order; and
a reflective structure extending upwardly from said front surface of said substrate and formed on an upper surface and side surfaces of said semiconductor epitaxial structure, a part of said reflective structure disposed on said side surfaces of said semiconductor epitaxial structure forming an optical waveguide structure to allow light having a first wavelength, upon entering said optical waveguide structure, to be fully transmitted therethrough and emitted outwardly, the first wavelength being different from a wavelength of light emitted from said semiconductor epitaxial structure, wherein the light having the first wavelength is a laser beam that is adapted for performing stealth dicing on said LED chip, and wherein the first wavelength of the laser beam ranges from 1000 nm to 1200 nm.

7. The LED chip as claimed in claim 6, wherein said reflective structure comprises a distributed Bragg reflector structure, said distributed Bragg reflector structure comprising n pairs of layers, each pair comprising a first material layer and a second material layer having different refractive indices, said first and second material layers in said distributed Bragg reflector structure being alternately stacked, n being an integer that is greater than or equal to 1, said first material layer having a refractive index greater than that of said second material layer.

8. The LED chip as claimed in claim 7, wherein n is an integer ranging from 2 to 40.

9. The LED chip as claimed in claim 7, wherein said first material layer is made of at least one material selected from the group consisting of $TiO_2$, $Nb_2O_5$, $TA_2O_5$, $HfO_2$, $ZrO_2$, and ZnO, and said second material layer is made of at least one material selected from the group consisting of $SiO_2$, $MgF_2$, $Al_2O_5$, and SiON.

10. The LED chip as claimed in claim 6, wherein said reflective structure has a reflectance of greater than 85% for light emitted from said semiconductor epitaxial structure.

11. A semiconductor light-emitting device, comprising:
a packaging frame; and
the LED chip as claimed in claim 1, said LED chip being mounted on said packaging frame.

12. A semiconductor light-emitting device, comprising:
a packaging frame; and
the LED chip as claimed in claim 6, said LED chip being mounted on said packaging frame.

13. A display device comprising a circuit board and a plurality of LED chips as claimed in claim 1 electrically connected to said circuit board.

14. A display device comprising a circuit board and a plurality of LED chips as claimed in claim 6 electrically connected to said circuit board.

15. A light-emitting diode (LED) chip, comprising:
a semiconductor epitaxial structure comprising a first semiconductor layer, an active layer, and a second semiconductor layer which are stacked on one another in such order; and
a reflective structure formed on an upper surface and side surfaces of said semiconductor epitaxial structure, and completely covering said side surfaces of said semiconductor epitaxial structure, said reflective structure having a reflectance of less than 30% for light having a first wavelength which is different from a wavelength of light emitted from said semiconductor epitaxial structure, said reflective structure including a distributed Bragg reflector structure which fully transmits the light having the first wavelength,
wherein the light having the first wavelength is a laser beam that is adapted for performing stealth dicing on said LED chip, and
wherein the first wavelength of the laser beam ranges from 1000 nm to 1200 nm.

16. The LED chip as claimed in claim 15, further comprising a substrate, said semiconductor epitaxial structure being formed on a surface of said substrate, said reflective structure being formed on said surface of said substrate and extending from said surface of said substrate to completely cover said side surfaces of said semiconductor epitaxial structure.

* * * * *